(12) United States Patent
Overstreet et al.

(10) Patent No.: US 9,625,515 B2
(45) Date of Patent: Apr. 18, 2017

(54) PREDICTING THE END OF SERVICE LIFE FOR A VACUUM ELECTRON DEVICE

(71) Applicant: Communications & Power Industries LLC, Palo Alto, CA (US)

(72) Inventors: John B. Overstreet, Los Gatos, CA (US); Michael J. Cascone, Sunnyvale, CA (US); John A. Lazar, Menlo Park, CA (US); Louis R. Falce, Surprise, AZ (US)

(73) Assignee: COMMUNICATIONS & POWER INDUSTRIES LLC, Palo Alto, CA (US)

( * ) Notice: Subject to any disclaimer, the term of this patent is extended or adjusted under 35 U.S.C. 154(b) by 215 days.

(21) Appl. No.: 14/300,214

(22) Filed: Jun. 9, 2014

(65) Prior Publication Data

US 2015/0355264 A1 Dec. 10, 2015

(51) Int. Cl.
*G01R 31/25* (2006.01)

(52) U.S. Cl.
CPC .................... *G01R 31/25* (2013.01)

(58) Field of Classification Search
CPC ....... G01R 31/25; G01R 31/24; G01R 31/257
USPC ................... 324/405; 445/3, 6, 63
See application file for complete search history.

(56) References Cited

U.S. PATENT DOCUMENTS

| | | | |
|---|---|---|---|
| 2,854,623 A * | 9/1958 | Wise .................. | G01R 31/25 324/409 |
| 4,752,743 A | 6/1988 | Pham et al. | |
| 5,191,338 A | 3/1993 | Katz et al. | |
| 5,493,177 A * | 2/1996 | Muller ................... | G01J 3/108 313/578 |
| 5,523,716 A | 6/1996 | Grebliunas et al. | |
| 6,456,009 B1 * | 9/2002 | Wright ................... | H01J 1/135 315/107 |
| 7,368,874 B2 | 5/2008 | Cascone et al. | |
| 2002/0057722 A1 * | 5/2002 | Kamon ................. | G11B 7/125 372/43.01 |
| 2012/0277832 A1 * | 11/2012 | Hussain ................ | A61N 1/378 607/62 |

OTHER PUBLICATIONS

Cronin, J.L., "Modern Dispenser Cathodes", IEE Proceedings Solid-State and Electronic Devices, vol. 128, No. 1, pp. 19-32, Feb. 1981.

* cited by examiner

*Primary Examiner* — Tung X Nguyen
*Assistant Examiner* — Robert P Alejnikov, Jr.
(74) *Attorney, Agent, or Firm* — Nixon Peabody LLP

(57) ABSTRACT

The subject matter described herein generally relates to apparatus, systems, methods and associated computer instructions for predicting the end of service life of a space charge limited vacuum electron device. The device produces an electron beam current and has a cathode and a filament powered by an adjustable voltage power supply providing a voltage between a first low voltage and a second higher voltage to heat the cathode to an electron emitting temperature. The process includes periodically, while the device is in operation, adjusting the voltage provided by the power supply while monitoring the beam current, determining a knee-point in the voltage where the beam current begins to decrease as the voltage is decreased, and calculating, based on the determined knee-point and a predetermined voltage vs service life remaining relationship, the amount of service life left in the device.

27 Claims, 8 Drawing Sheets

PREDICTING THE END OF SERVICE LIFE FOR A VACUUM ELECTRON DEVICE

TECHNICAL FIELD

The present disclosure relates generally to predicting the end of service life for a vacuum electron device.

BACKGROUND

Space charge limited vacuum electron devices (VEDs) such as triodes, tetrodes, travelling wave tubes and the like (but not including gyrotrons and similar devices) include a directly or indirectly heated cathode which is heated to a high temperature by a filament and includes a low work function electron emitting material such as barium or thoriated tungsten. The electrons are emitted and formed into an electron beam which is generally modulated and amplified by the VED. Such VEDs are used in broadcast transmitters, vacuum tubes, cathode ray tubes, television tubes, satellite ground stations, other forms of communications equipment and other forms of equipment requiring a high-power source of radio frequency (RF) energy.

As the filament voltage is increased in such a VED the temperature of the cathode increases and the emission of electrons generally increases unless the electron emitting material has been exhausted at which point the VED has reached its actual end of life. An increase of electron emission corresponds with a beam current increase as the electrons form the beam current of the VED. As a VED ages, if its filament voltage is held constant it will exhibit a roll off of beam current leading to end of life. Increasing the filament voltage of the VED as it ages will tend to extend the effective service life of the VED to a point.

OVERVIEW

The subject matter described herein generally relates to apparatus, systems, methods and associated computer instructions for predicting the end of service life of a space charge limited VED. The VED produces an electron beam current and has a cathode and a filament powered by an adjustable voltage power supply providing a voltage between a first low voltage and a second higher voltage to heat the cathode to an electron emitting temperature. The process includes periodically, while the device is in operation, adjusting the voltage provided by the power supply while monitoring the beam current, determining a knee-point in the voltage where the beam current begins to decrease as the voltage is decreased, and calculating, based on the determined knee-point and a predetermined filament voltage vs service life remaining relationship, the amount of service life left in the device. The remaining service life may be displayed or some indication thereof provided to a user.

The foregoing overview is a summary and thus may contain simplifications, generalizations, and omissions of detail; consequently those skilled in the art will appreciate that the overview is illustrative only and is not intended to be in any way limiting.

BRIEF DESCRIPTION OF THE DRAWINGS

The accompanying drawings, which are incorporated into and constitute a part of this specification, illustrate one or more exemplary embodiments and, together with the description of the exemplary embodiments, serve to explain the principles and implementations of the invention.

In the drawings.

DESCRIPTION OF EXAMPLE EMBODIMENTS

Exemplary embodiments are described herein in the context of a system for predicting the end of service life of a vacuum electron device. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the exemplary embodiments as illustrated in the accompanying drawings. The same reference indicators will be used to the extent possible throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

References herein to "one embodiment" or "an embodiment" or "one implementation" or "an implementation" means that a particular feature, structure, part, function or characteristic described in connection with an exemplary embodiment can be included in at least one exemplary embodiment. The appearances of phrases such as "in one embodiment" or "in one implementation" in different places within this specification are not necessarily all referring to the same embodiment or implementation, nor are separate and alternative embodiments necessarily mutually exclusive of other embodiments.

In accordance with this disclosure, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

Figure 1:
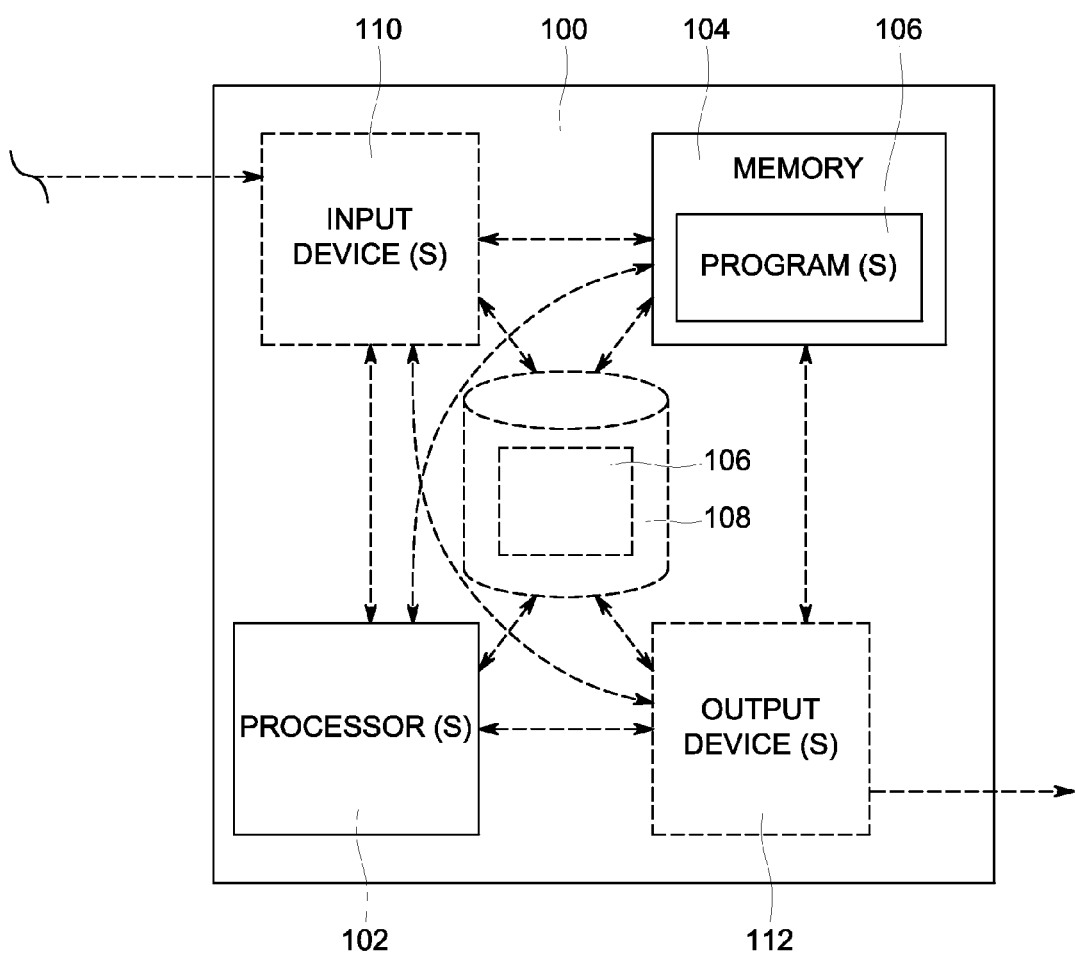
FIG. 1 is a system block diagram illustrating a computer system configured for implementing at least one of a method, a system and software in accordance with exemplary embodiments.

FIG. 1 is a system block diagram illustrating a computer system configured for implementing at least one of a method, a system and software in accordance with exemplary embodiments. FIG. 1 depicts a device or a computer system 100 comprising one or more processors 102 and a memory 104 storing one or more programs 106 for execution by the one or more processors 102.

In some embodiments, the device or computer system 100 can further comprise a non-transitory computer-readable storage medium 108 storing the one or more programs 106 for execution by the one or more processors 102 of the device or computer system 100.

In some embodiments, the device or computer system 100 can further comprise one or more input devices 110, which can be configured to send or receive information to or from any one from the group consisting of: an external device (not shown), the one or more processors 102, the memory 104, the non-transitory computer-readable storage medium 108, and one or more output devices 112.

In some embodiments, the device or computer system 100 can further comprise one or more output devices 112, which can be configured to send or receive information to or from any one from the group consisting of: an external device (not shown in FIG. 1), the one or more processors 102, the memory 104, and the non-transitory computer-readable storage medium 108.

In accordance with, for example, claim 1, [a] method for . . . [comprises]: A method, apparatus and system for predicting the end of service life of a space charge limited VED producing an electron beam current and having a cathode and a filament powered by an adjustable voltage power supply providing a voltage between a first low voltage and a second high voltage to heat the cathode to an electron emitting temperature includes adjusting the voltage provided by the power supply while monitoring the beam current periodically, while the device is in operation, determining a knee-point in the voltage where the beam current begins to decrease as the voltage is decreased, and calculating, based on the determined knee-point and a predetermined filament voltage vs service life relationship, the amount of service life left in the device. The remaining service life may be displayed or some indication thereof provided.

Each of the above identified steps, modules or programs corresponds to a set of instructions for performing a function described above. These modules and programs (i.e., sets of instructions) need not be implemented as separate software programs, procedures or modules, and thus various subsets of these modules may be combined or otherwise re-arranged in various embodiments. In some embodiments, memory may store a subset of the modules and data structures identified above. Furthermore, memory may store additional modules and data structures not described above.

The illustrated aspects of the disclosure may also be practiced in distributed computing environments where certain tasks are performed by remote processing devices that are linked through a data communications network. In a distributed computing environment, program modules can be located in both local and remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more integrated circuit (IC) chips. For example, in one embodiment, a set of components can be implemented in a single IC chip. In other embodiments, one or more of respective components are fabricated or implemented on separate IC chips.

What is described here includes examples of the embodiments of the present invention. It is, of course, not possible to describe every conceivable combination of components or methodologies for purposes of describing the claimed subject matter, but it is to be appreciated that many further combinations and permutations of the subject innovation are possible. Accordingly, the claimed subject matter is intended to embrace all such alterations, modifications, and variations that fall within the spirit and scope of the appended claims. Moreover, the above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In particular and in regard to the various functions performed by the above described components, devices, circuits, systems and the like, the terms used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter. In this regard, it will also be recognized that the innovation includes a system as well as a computer-readable storage medium having computer-executable instructions for performing the acts and/or events of the various methods of the claimed subject matter.

The aforementioned systems, circuits and modules are described herein with respect to interaction between several components or blocks. It can be appreciated that such systems, circuits and modules circuits and components or blocks can include those components or specified subcomponents, some of the specified components or sub-components, and/or additional components, and according to various permutations and combinations of the foregoing. Subcomponents can also be implemented as components communicatively coupled to other components rather than included within parent components. Additionally, it should be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but known by those of skill in the art.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

As used in this application, the terms "component," "module," "system," or the like are generally intended to refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

Moreover, the words "example" or "exemplary" are used herein to mean serving as an example, instance, or illustration. Any aspect or design described herein as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Computing devices typically include a variety of media, which can include tangible computer-readable storage media and/or communications media, in which these two terms are used herein differently from one another as follows. Tangible computer-readable storage media can be any available storage media that can be accessed by the computer, is typically of a non-transitory nature, and can include both volatile and nonvolatile media, removable and non-removable media. By way of example, and not limitation, tangible computer-readable storage media can be implemented in connection with any method or technology for storage of information such as computer-readable instructions, program modules, structured data, or unstructured data. Tangible computer-readable storage media can include, but are not limited to, RAM (random access memory), ROM (read-only memory), PROM (programmable read-only memory), EEPROM (electrically eraseable programmable read-only memory), flash memory, jump drives, USB (universal serial bus) drives (and the like) or other memory technology, compact disk (CD and CD-ROM), digital versatile disk (DVD and DVD-ROM), paper card, paper tape or other information storage media, magnetic cassettes, magnetic tape, magnetic disk storage or other magnetic storage devices, or other tangible and/or non-transitory media which can be used to store desired information. Tangible computer-readable storage media can be accessed by one or more local or remote computing devices, e.g., via access requests, queries or other data retrieval protocols, for a variety of operations with respect to the information stored by the medium.

On the other hand, communications media typically embody computer-readable instructions, data structures, program modules or other structured or unstructured data in a data signal that can be transitory such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

In view of the exemplary systems described above, methodologies that may be implemented in accordance with the described subject matter will be better appreciated with reference to the flowcharts of the various figures. For simplicity of explanation, the methodologies are depicted and described as a series of acts. However, acts in accordance with this disclosure can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be appreciated that the methodologies disclosed in this specification are capable of being stored on an article of manufacture to facilitate transporting and transferring such methodologies to computing devices. The term article of manufacture, as used herein, is intended to encompass a computer program accessible from any computer-readable device or storage media.

Figure 2:
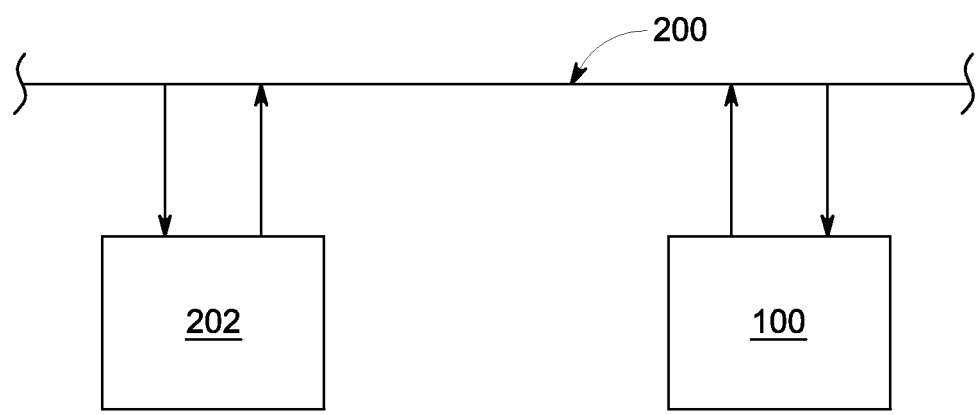
FIG. 2 is a system block diagram illustrating a portion of a data communications network coupling a user's computer device to a server device.

FIG. 2 is a system block diagram illustrating a portion of a data communications network coupling a computer system to a user's computer. This is a typical scenario wherein a computer system 100 such as a web server provides computer functionality to a user's computer 202 over a data communications network 200 such as the Internet. The user's computer 202 may be coupled via wires and/or wirelessly to the data communications network 200 so that the user may access the computer system 100.

Vacuum electron devices (VEDs) employ heated cathodes to enhance thermionic electron emission in order to form an electron beam. There are three types of thermionic electron emission mechanisms used for VED cathodes. These are: (1) emission from a semiconductor; (2) emission from a hot metal surface such as a directly heated tungsten filament; and (3) emission from an activated hot metal surface such as a tungsten dispenser-type cathode.

In the first case, emission from a semiconductor, the electron emission comes from within a coating of an electron emitting material (such as BaO) on the cathode itself. It is emission from a semiconductor in that the electron is extracted from the BaO matrix from a donor site created by an oxygen vacancy. Such indirectly heated cathode assemblies comprise a filament which heats up and a cathode in close proximity thereto so that it is heated by the filament. The most common type of indirectly-heated cathode is the oxide-coated cathode, in which typically a nickel cathode surface has a coating comprising an alkaline earth metal oxide to increase electron emission. One material commonly used is barium oxide as it forms a monatomic layer of barium with an extremely low work function (the energy required to release it from the cathode). Other cathode materials comprise barium oxide in various mixtures with various combinations of strontium oxide, calcium, calcium oxide and aluminum oxide in various ratios. Thorium oxide can be used as well as lanthanum hexaboride, cerium hexaboride, calcium hexaboride, strontium hexaboride, barium hexaboride, yttrium hexaboride, gadolinium hexaboride, samarium hexaboride, thorium hexaboride, similar materials and combinations thereof.

In the second case, emission from a hot metal surface, directly heated cathodes incorporate the filament and the cathode as one part. Current flowing through the filament directly heats the cathode formed on the filament. The most common type of directly heated cathode, used in most high power transmitting tubes, is the thoriated tungsten filament formed of tungsten with a coating of thorium oxide. Alternative materials for thorium oxide include zirconium dioxide, lanthanum(III) oxide, yttrium(III) oxide, cerium(IV) oxide, and their mixtures, carbides and borides of transition metals, e.g. zirconium carbide, hafnium carbide, tantalum carbide, hafnium diboride, and their mixtures, metals from groups IIIB (scandium, yttrium, and some lanthanides, often gadolinium and samarium) and IVB (hafnium, zirconium, titanium). Alternatives to tungsten include other refractory metals and alloys, e.g., tantalum, molybdenum and rhenium and their alloys.

A barrier layer of other material can be placed between the base metal and the emission layer, to inhibit chemical reaction between these. The material has to be resistant to high temperatures, have high melting point and very low vapor pressure, and be electrically conductive. Materials used include, e.g., tantalum diboride, titanium diboride, zirconium diboride, niobium diboride, tantalum carbide, zirconium carbide, tantalum nitride, and zirconium nitride.

In the third case, emission from an activated hot metal surface, which is most commonly used with TWTs, the electron source is a tungsten dispenser cathode. In this instance as in the second case described above (directly heated cathode) the electrons come from the metal (as opposed to a coating) based on its work function. Tungsten alone has a work function of 4.5 eV. When a monolayer of barium over oxygen is deposited on a tungsten surface the work function drops to around 2 eV. This cathode type includes a porous tungsten body that is infiltrated with a barium compound (typically barium calcium aluminate) that when heated decomposes and releases barium which migrates to the tungsten surface uniformly coating it to lower its work function. The present invention is particularly directed to this third type of cathode and predicts the depletion of the reservoir of electron emitting barium.

VEDs such as TWTs can be quite expensive devices and have long lead times for delivery once an order is placed. Often such VEDs can last much longer than their warranty coverage or mean time between failure (MTBF) might indicate, particularly if used in accordance with the techniques taught in U.S. Pat. No. 6,456,009, commonly assigned herewith. Knowing with some degree of certainty when the end of life of such a device is likely to occur can help a customer reduce its inventory of high-cost replacement parts while providing some assurance of continued operation in the event of a predicted end of life event.

The active material (electron emitting material) in cathodes is depleted in a non-linear fashion over time if a fixed filament voltage is utilized. This renders most estimating techniques unreliable in determining a likely end of life for a VED.

Figure 3:
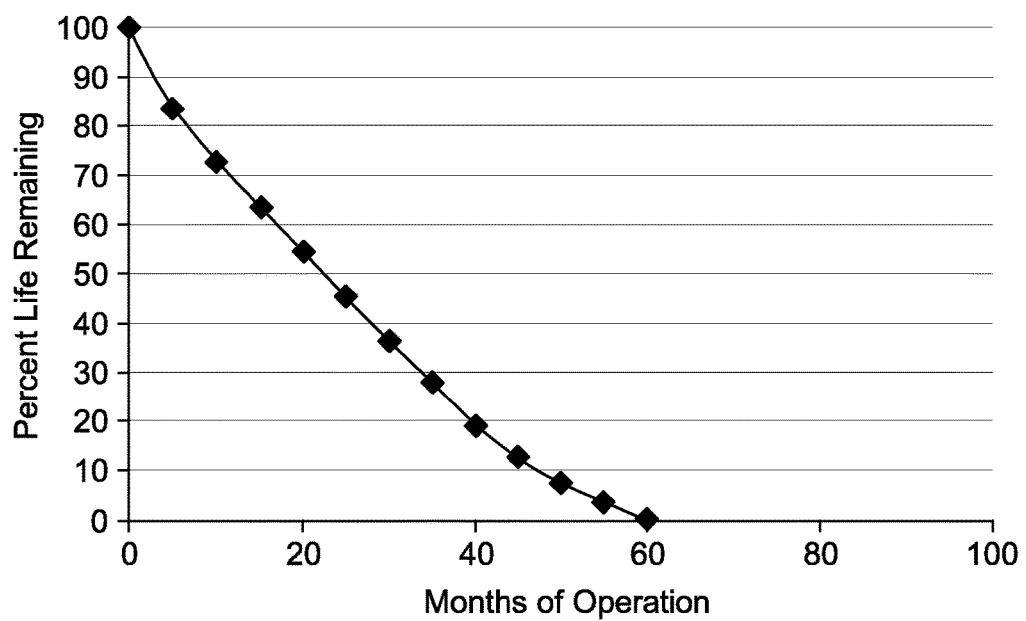
FIG. 3 is a graph of percent of life remaining vs months of operation achieved for a typical VED.

FIG. 3 is a graph of percent of life remaining vs months of operation achieved for a typical VED. FIG. 3 is an idealized graph showing percent of life remaining (in time) on the vertical axis vs. months of operation achieved for a typical ED such as a TWT. A typical VED using a fixed filament voltage during its lifetime will commonly exhibit the behavior shown in FIG. 3, i.e., a non-linear roll-off. The end of life point is the point at which the curve hits zero percent remaining life. As a practical matter no one can predict using any method the precise point of VED failure, however one can predict when it is close based upon the use of the electron emitting material and that point is termed the "end of service life". The tube might operate an hour, a day or even a month or two past that point, but once it reaches the end of service life, a failure and consequent replacement is imminent. Having this foreknowledge is of some utility to customers.

Figure 4:
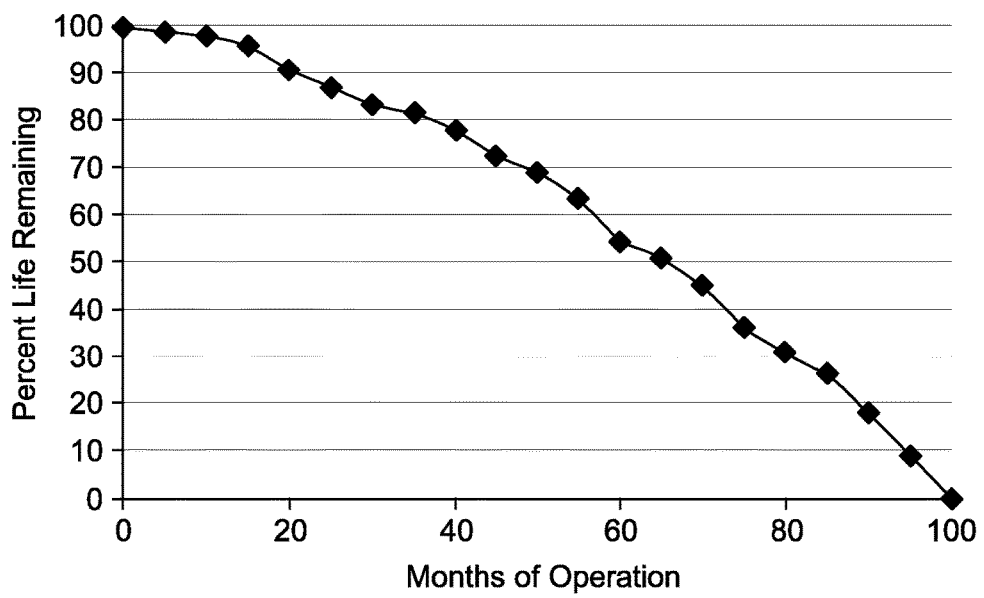
FIG. 4 is a graph of percent of life remaining vs months of operation achieved for a VED employing an adjustable filament power supply.

FIG. 4 is a graph of percent of life remaining vs months of operation achieved for a VED employing an adjustable filament power supply. This is an idealized graph of percent of life remaining (in time) on the vertical axis vs. months of operation achieved for a typical TWT VED operating in accordance with U.S. Pat. No. 6,456,009. A typical VED using this technique of increasing the filament voltage over the life of the VED will commonly exhibit the behavior shown in FIG. 4, i.e., a more linear roll-off with significantly extended life.

A VED's life expectancy is generally linked to cathode life as there is little else to fail. Although cathodes can potentially last in excess of 100,000 hours of operation in certain applications, they usually fail long before that because the temperature at which they operate is not optimized. This generally comes from operating them at a fixed filament voltage. If the cathode temperature is set too high to achieve the required beam current using the thermionic effect the active material will be depleted too quickly. If it is set too low the electron beam will not be correctly focused. The adjustment occurs between a first filament voltage and a second (higher) filament voltage, the first filament voltage being the voltage used at the beginning of life and the second being that used at the end of life. As the VED ages in use, the cathode should preferably be operated at higher temperatures (corresponding to higher filament voltages) in order to produce a given beam current.

Figure 5:
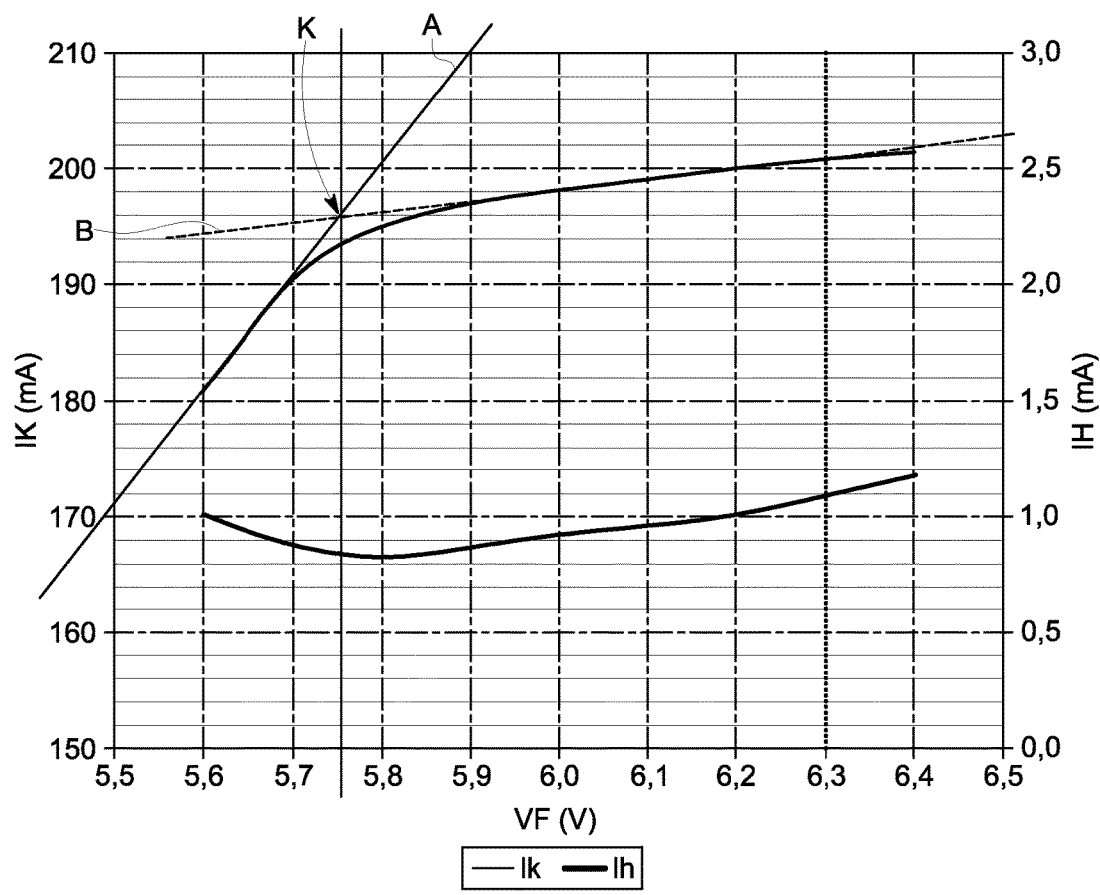
FIG. 5 is a typical Miram-Curve for a Travelling Wave Tube.

FIG. 5 is a typical Miram-Curve for a Travelling Wave Tube. The Miram-Curve plot of FIG. 5 has a horizontal axis of filament voltage in volts, a left vertical axis of Beam Current in mA and a right vertical axis of Helix Current in mA. The Miram "knee" (denoted "K" in the figure) is the point at which the Beam Current (Cathode Current) or 98% FSCL (Fully Space Charge Limited) point begins to drop rapidly with a DECREASE in filament voltage. It is also the point at which the slopes of lines "A" and "B" intersect. "A" being a line tangential to the Current vs Voltage plot ABOVE the knee and "B" being a line tangential to the Current vs Voltage plot BELOW the knee. Point K will shift toward the right over time as electron emitting material in the cathode is used up and higher cathode temperatures (and hence higher filament voltages) are required to achieve the same level of electron emission. At some point, however, the electron emitting material in the cathode is essentially used up and even drastic increases in filament voltage will not help —this corresponds to the physical end of life of the VED.

Figure 6:
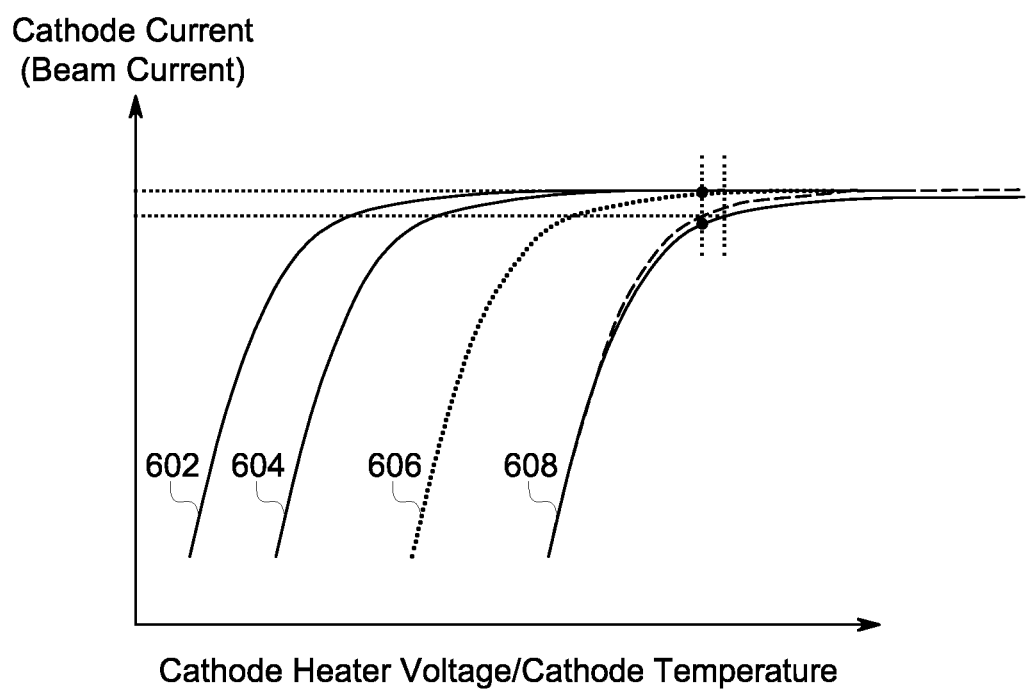
FIG. 6 is a time series of Miram-Curves for a Travelling Wave Tube showing how they shift to the right as the tube ages.
Figure 7:
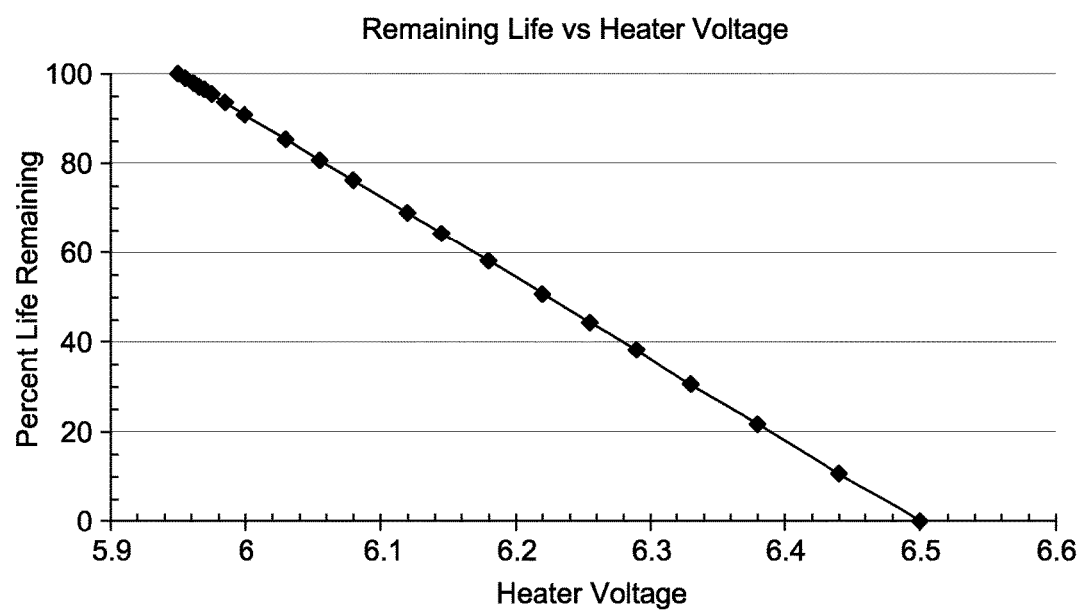
FIG. 7 is a graph illustrating predicted percent of life remaining vs filament voltage for a typical VED in accordance with an embodiment.
Figure 8:
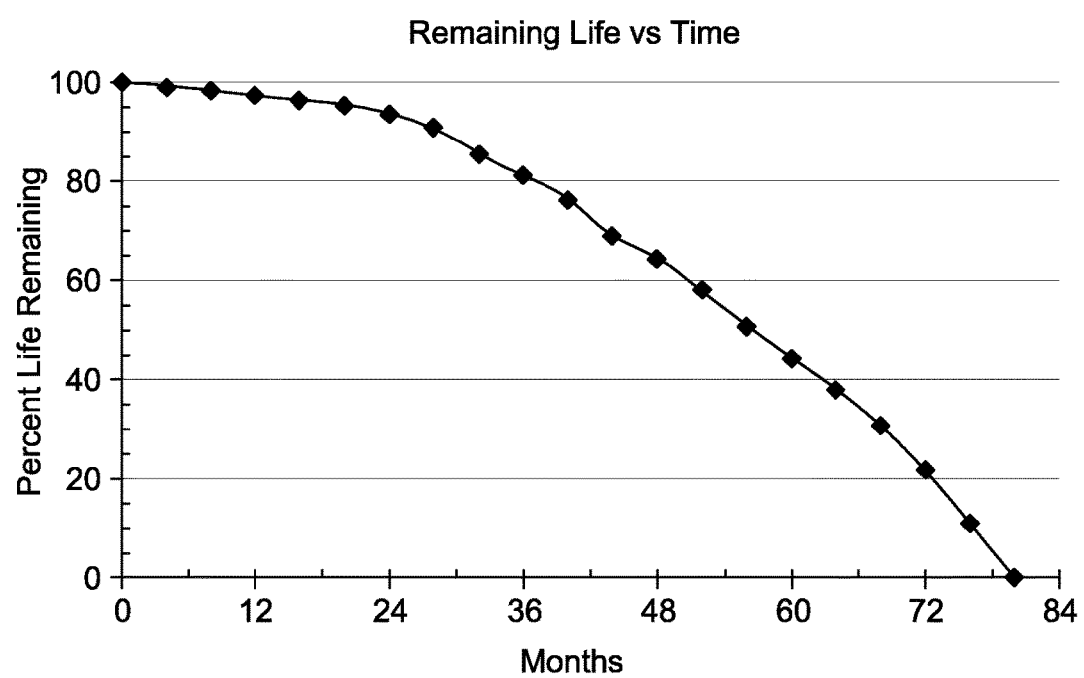
FIG. 8 is a graph illustrating predicted percent of life remaining vs months of operation achieved for a typical VED in accordance with an embodiment.

FIG. 6 is a time series of Miram-Curves for a Travelling Wave Tube showing how they shift to the right as the VED ages. Curve 602 is typical of a Miram-Curve early in the life of the VED. Curves 604, 606 and 608 are taken progressively later in the life of the VED.

TABLE 1

| Month | Heater Voltage (VDC) | | Remaining Life (VDC) | Remaining Life (%) |
|---|---|---|---|---|
| | Knee | Setting | | |
| 0 | 5.750 | 5.950 | 0.550 | 100 |
| 4 | 5.755 | 5.955 | 0.545 | 99 |
| 8 | 5.760 | 5.960 | 0.540 | 98 |
| 12 | 5.765 | 5.965 | 0.535 | 97 |
| 16 | 5.770 | 5.970 | 0.530 | 96 |
| 20 | 5.775 | 5.975 | 0.525 | 95 |
| 24 | 5.785 | 5.985 | 0.515 | 84 |
| 28 | 5.800 | 6.000 | 0.500 | 82 |
| 32 | 5.830 | 6.030 | 0.470 | 81 |
| 36 | 5.855 | 6.055 | 0.445 | 73 |
| 40 | 5.880 | 6.080 | 0.420 | 69 |
| 44 | 5.920 | 6.120 | 0.380 | 64 |
| 48 | 5.945 | 6.145 | 0.355 | 55 |
| 52 | 5.980 | 6.180 | 0.320 | 51 |
| 56 | 6.020 | 6.220 | 0.280 | 45 |
| 60 | 6.055 | 6.255 | 0.245 | 36 |
| 64 | 6.090 | 6.290 | 0.210 | 27 |
| 68 | 6.130 | 6.330 | 0.170 | 26 |
| 72 | 6.180 | 6.380 | 0.120 | 18 |
| 76 | 6.240 | 6.440 | 0.060 | 9 |
| 80 | 6.300 | 6.500 | 0.000 | 0 |

TABLE 1 is a table illustrating measured Miram-Curve knee voltage, remaining voltage to maximum filament voltage and percent of service life remaining for a typical VED. Column 1 (Month) is the months of operation achieved by the VED. Knee is the measured Miram-Curve knee point "K" in VDC. Setting is the actually filament voltage set point (in this case always 200 mV above the knee point) in VDC. Remaining Life (VDC) is the number of volts between the Setting and the highest voltage that can be delivered to the filament. In this case the filament can be supplied with 6.5 volts. This voltage may be determined by the power supply (i.e., the power supply may have a maximum voltage value of 6.5 volts) or it may be determined by the maximum voltage that can actually be applied to the filament (e.g., more than 6.5 volts would cause a rapid failure in the filament). Whatever the case, Remaining Life (%) is a prediction of the end of service life for the VED and is determined as follows: If the Beginning of service life corresponds to a voltage of 5.95 VDC for the Filament Voltage Set Point, the End of Service Life corresponds to a voltage of 6.50 VDC Filament Voltage Set Point, than 0.55 VDC separate the beginning and the end. At any point, then 100/0.55*the voltage set point is equal to the percent of service life remaining So at 5.95 VDC this value is 100%; at 6.50 VDC this value is 0%. This is a predetermined filament voltage vs. service life remaining relationship and while the VED might not fail instantly upon hitting 0% service life remaining, its failure will occur soon after, e.g., once the knee of the Miram-Curve moves up the 200 mV difference between the filament voltage set point and the Knee.

Once the remaining service life gets below a predetermined threshold the system may be configured to provide a user with a warning that the VED is nearing end of life. This may be achieved, for example, by turning on a warning indicator visible to an operator, sending a message over data communications network 200 to a user's computer 202, or the like. For example, a "gas" gauge could be provided which at any point in time indicates the percent of service life remaining in the VED. In this way, an operator may take appropriate action at an efficient point in time such as obtaining a spare tube, or the like.

In one embodiment a control system managing a VED such as one of those described herein may be configured to monitor the time that the tube is turned on and based on the average number of hours of use per day provide an output such as a display showing the end of service life as an approximate date. For example, if the VED were used 24 hours per day (which is often the case in practice) the 0% end of service life could be predicted as a number of months from start of service life (e.g., with reference to Table 1 or a similar table or algorithm) and the date predicted by adding the number of months (or other denomination of time) remaining to the present date to obtain an estimated date for end of service life. As discussed before, it is only an estimate but it would be helpful to some customers. If, for example, the average use of the VED were 12 hours per day or some other value, the estimated date for the end of service life would be suitably extended—i.e., doubled in the case of 12 hour per day average use.

While exemplary embodiments and applications have been shown and described, it would be apparent to those skilled in the art having the benefit of this disclosure that numerous modifications, variations and adaptations not specifically mentioned above may be made to the various exemplary embodiments described herein without departing from the scope of the invention which is defined by the appended claims.

What is claimed is:

1. A method for predicting the end of service life of a space charge limited vacuum electron device producing an electron beam current and having a cathode and a filament powered by an adjustable voltage power supply providing a voltage between a first low voltage and a second high voltage to heat the cathode to an electron emitting temperature, the method comprising:
   adjusting the voltage provided by the power supply while monitoring the beam current of the space charged limited vacuum electron device periodically, while the space charged limited vacuum electron device is in operation;
   determining a knee-point in the voltage where the beam current of the space charged limited vacuum electron device begins to decrease as the voltage is decreased; and
   calculating the amount of service life left in the space charged limited vacuum electron device based on the determined knee-point and a predetermined relationship between a filament voltage of the space charged limited vacuum electron device and the service life remaining for the space charged limited vacuum electron device.

2. The method of claim 1, wherein the vacuum electron device is a travelling wave tube.

3. The method of claim 1, wherein the vacuum electron device is a triode.

4. The method of claim 1, wherein the vacuum electron device is a tetrode.

5. The method of claim 1, wherein the cathode comprises barium.

6. The method of claim 1, wherein the cathode comprises thoriated tungsten.

7. The method of claim 1, wherein the cathode is a tungsten dispenser cathode.

8. The method of claim 1, further comprising displaying the calculated amount of service life left in the device.

9. The method of claim 8, wherein the displaying comprises displaying an estimated date of end of service life.

10. An apparatus for predicting the end of service life of a space charge limited vacuum electron device producing an electron beam current and having a cathode and a filament powered by an adjustable voltage power supply providing a voltage between a first low voltage and a second high voltage to heat the cathode to an electron emitting temperature, the apparatus comprising:
    means for adjusting the voltage provided by the power supply while monitoring the beam current of the space charged limited vacuum electron device periodically, while the space charged limited vacuum electron device is in operation;
    means for determining a knee-point in the voltage where the beam current of the space charged limited vacuum electron device begins to decrease as the voltage is decreased; and
    means for calculating an amount of service life left in the space charged limited vacuum electron device based on the determined knee-point and a predetermined relationship between a filament voltage of the space charged limited vacuum electron device and the service life remaining for the space charged limited vacuum electron device.

11. The apparatus of claim 10, wherein the vacuum electron device is a travelling wave tube.

12. The apparatus of claim 10, wherein the vacuum electron device is a triode.

13. The apparatus of claim 10, wherein the vacuum electron device is a tetrode.

14. The apparatus of claim 10, wherein the cathode comprises barium.

15. The apparatus of claim 10, wherein the cathode comprises thoriated tungsten.

16. The apparatus of claim 10, wherein the cathode is a tungsten dispenser cathode.

17. The apparatus of claim 10, further comprising means for displaying the calculated amount of service life left in the device.

18. The apparatus of claim 17, wherein the means for displaying comprises means for displaying an estimated date of end of service life.

19. A system for predicting the end of service life of a space charge limited vacuum electron device producing an electron beam current and having a cathode and a filament powered by an adjustable voltage power supply providing a voltage between a first low voltage and a second high voltage to heat the cathode to an electron emitting temperature, the system comprising:
    a circuit configured to measure the voltage;
    a circuit configured to measure the beam current;
    a circuit configured to adjust the voltage provided by the power supply while monitoring the beam current of the space charged limited vacuum electron device periodically, while the space charged limited vacuum electron device is in operation;
    a processor configured to determine a knee-point in the voltage where the beam current of the space charged limited vacuum electron device begins to decrease as the voltage is decreased;
    the processor further configured to calculate an amount of service life left in the space charged limited vacuum electron device based on the determined knee-point and a predetermined relationship between a filament voltage of the space charged limited vacuum electron device and the service life remaining for the space charged limited vacuum electron device; and
    an output device for outputting a message indicative of the calculated remaining service life.

20. The system of claim 19, wherein the vacuum electron device is a travelling wave tube.

21. The system of claim 19, wherein the vacuum electron device is a triode.

22. The system of claim 19, wherein the vacuum electron device is a tetrode.

23. The system of claim 19, wherein the cathode comprises barium.

24. The system of claim 19, wherein the cathode comprises thoriated tungsten.

25. The system of claim 19, wherein the cathode is a tungsten dispenser cathode.

26. The system of claim 19, wherein the output device is configured to output the calculated remaining service life as an estimated date of end of service life.

27. A computer program product for predicting the end of service life of a space charge limited vacuum electron device producing an electron beam current and having a cathode and a filament powered by an adjustable voltage power supply providing a voltage between a first low voltage and a second high voltage to heat the cathode to an electron emitting temperature, the computer program product comprising:
    a computer readable storage medium having computer readable code embodied therewith, the computer readable code comprising:
    computer readable program code configured to cause a circuit to measure the voltage;
    computer readable program code configured to cause a circuit to measure the beam current;
    computer readable program code configured to cause a circuit to adjust the voltage provided by the power supply while monitoring the beam current of the space charged limited vacuum electron device periodically, while the space charged limited vacuum electron device is in operation;
    computer readable code configured to determine a knee-point in the voltage where the beam current of the space charged limited vacuum electron device begins to decrease as the voltage is decreased;
    computer readable code configured to calculate an amount of service life left in the space charged limited vacuum electron device based on the determined knee-point and a predetermined relationship between a filament voltage of the space charged limited vacuum electron device and the service life remaining for the space charged limited vacuum electron device; and
    computer readable code configured to cause an output device to output a message indicative of the calculated remaining service life.

* * * * *